United States Patent
Laskaris et al.

[11] Patent Number: 6,150,819
[45] Date of Patent: Nov. 21, 2000

[54] LAMINATE TILES FOR AN MRI SYSTEM AND METHOD AND APPARATUS FOR MANUFACTURING THE LAMINATE TILES

[75] Inventors: Evangelos T. Laskaris, Niskayuna; William D. Barber, Ballston Lake; Bulent Aksel, Clifton Park; Richard A. Ranze, Scotia, all of N.Y.

[73] Assignee: General Electric Company, Schenectady, N.Y.

[21] Appl. No.: 09/198,510

[22] Filed: Nov. 24, 1998

[51] Int. Cl.[7] ........................................... G01V 3/00
[52] U.S. Cl. .............................. 324/319; 29/609
[58] Field of Search ................... 324/318, 319, 324/320, 322; 29/609, 598, 602.1, 603.2, 603.23

[56] References Cited

U.S. PATENT DOCUMENTS

| | | | |
|---|---|---|---|
| 4,085,603 | 4/1978 | Vanek | 29/609 |
| 4,496,395 | 1/1985 | Croat | 75/123 |
| 4,540,453 | 9/1985 | Boredelon et al. | 148/31.55 |
| 4,753,822 | 6/1988 | Van Mensvoort | 29/609 |
| 4,818,966 | 4/1989 | Miyamoto et al. | 335/296 |
| 5,240,541 | 8/1993 | Lin et al. | 29/609 |
| 5,252,924 | 10/1993 | Sakurai et al. | 324/320 |
| 5,283,544 | 2/1994 | Sakurai et al. | 335/297 |
| 5,317,297 | 5/1994 | Kaufman et al. | 335/297 |
| 5,383,978 | 1/1995 | Yamamoto et al. | 148/101 |
| 5,631,616 | 5/1997 | Ohta et al. | 335/216 |
| 5,680,086 | 10/1997 | Allis et al. | 335/296 |
| 5,839,185 | 11/1998 | Smith et al. | 29/609 |

*Primary Examiner*—Louis Arana
*Attorney, Agent, or Firm*—Foley & Lardner

[57] ABSTRACT

A laminate tile pole piece for an MRI, a method and an apparatus for manufacturing laminate tile metal pole pieces for an MRI. Each laminate tile has a trapezoidal or annular sector shape. The trapezoidal shape allows the tiles to be attached side by side to form a multiple concentric ring pole piece without using oddly shaped edge filler tiles needed to fill a circular pole piece with square tiles. The laminate tiles are formed by unwinding a metal ribbon, guiding the ribbon through an adhesive bath, winding the ribbon on a polygonal bobbin, such as a rectangular bobbin, to form a coil with at least one flat side, removing the coil from the bobbin, cutting the coil into laminate bars and shaping the laminate bars into trapezoidal or annular sector shaped laminate tiles. The apparatus contains an adhesive bath, a polygonal shaped bobbin, bobbin side plates for guiding the ribbon onto the bobbin and pressure plates for controlling the thickness of the coil. The apparatus also contains a cutting tool for cutting the coil into laminate bars after the coil is removed from the bobbin and a water jet to shape the laminate bars into trapezoidal or annular sector shaped laminate tiles.

25 Claims, 15 Drawing Sheets

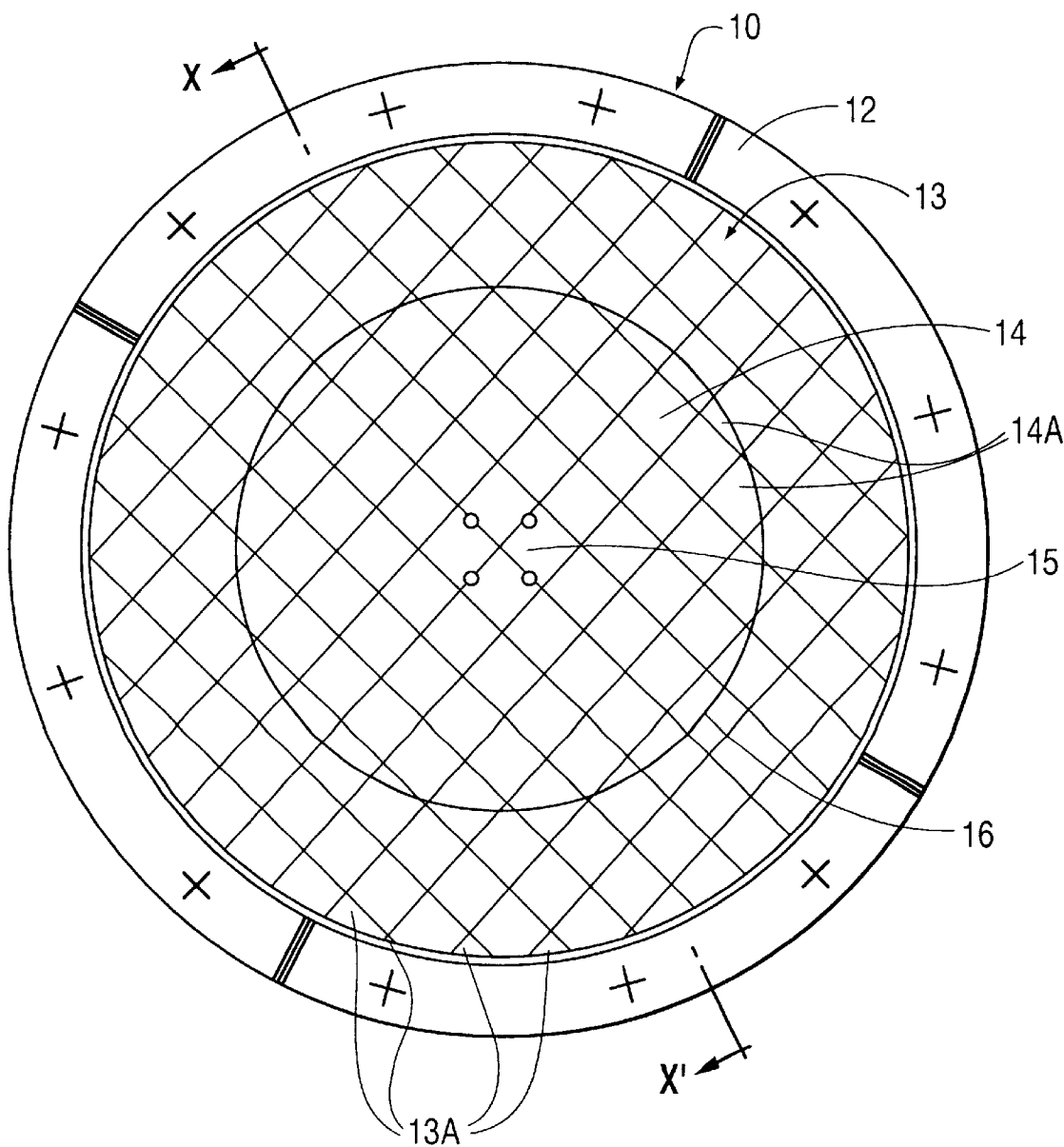

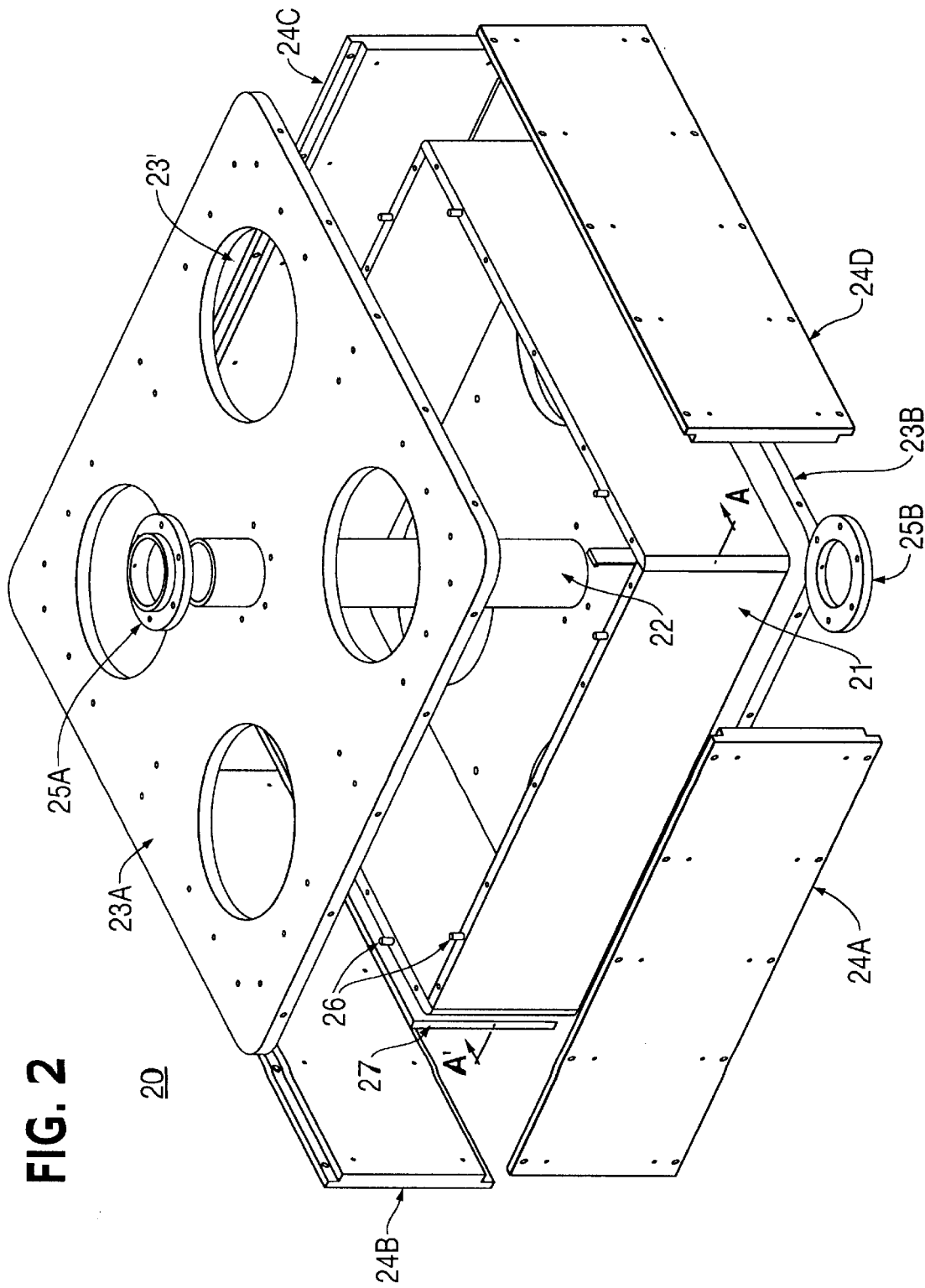

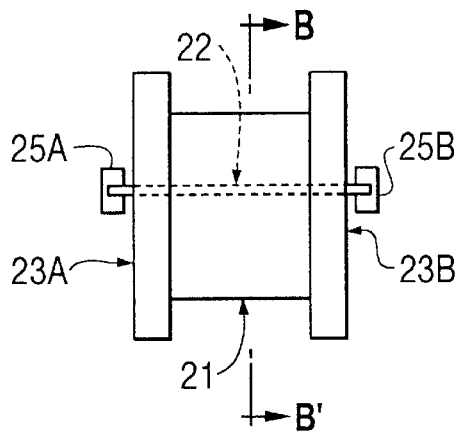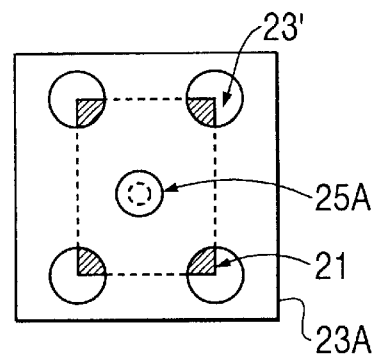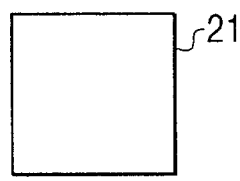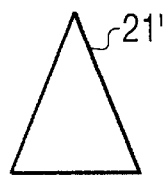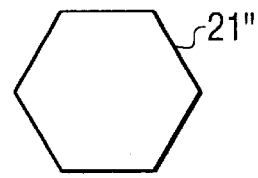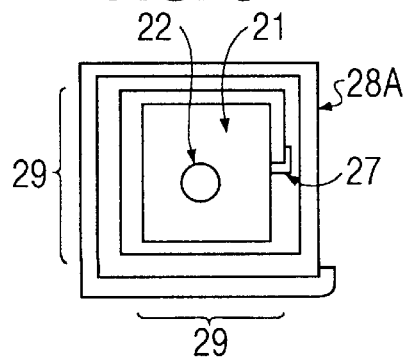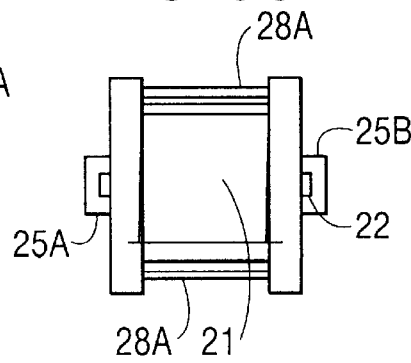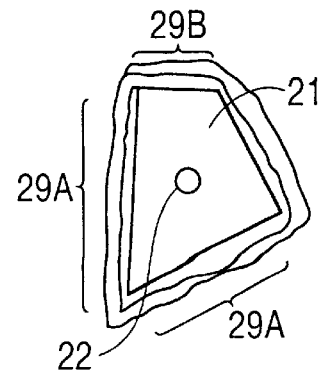

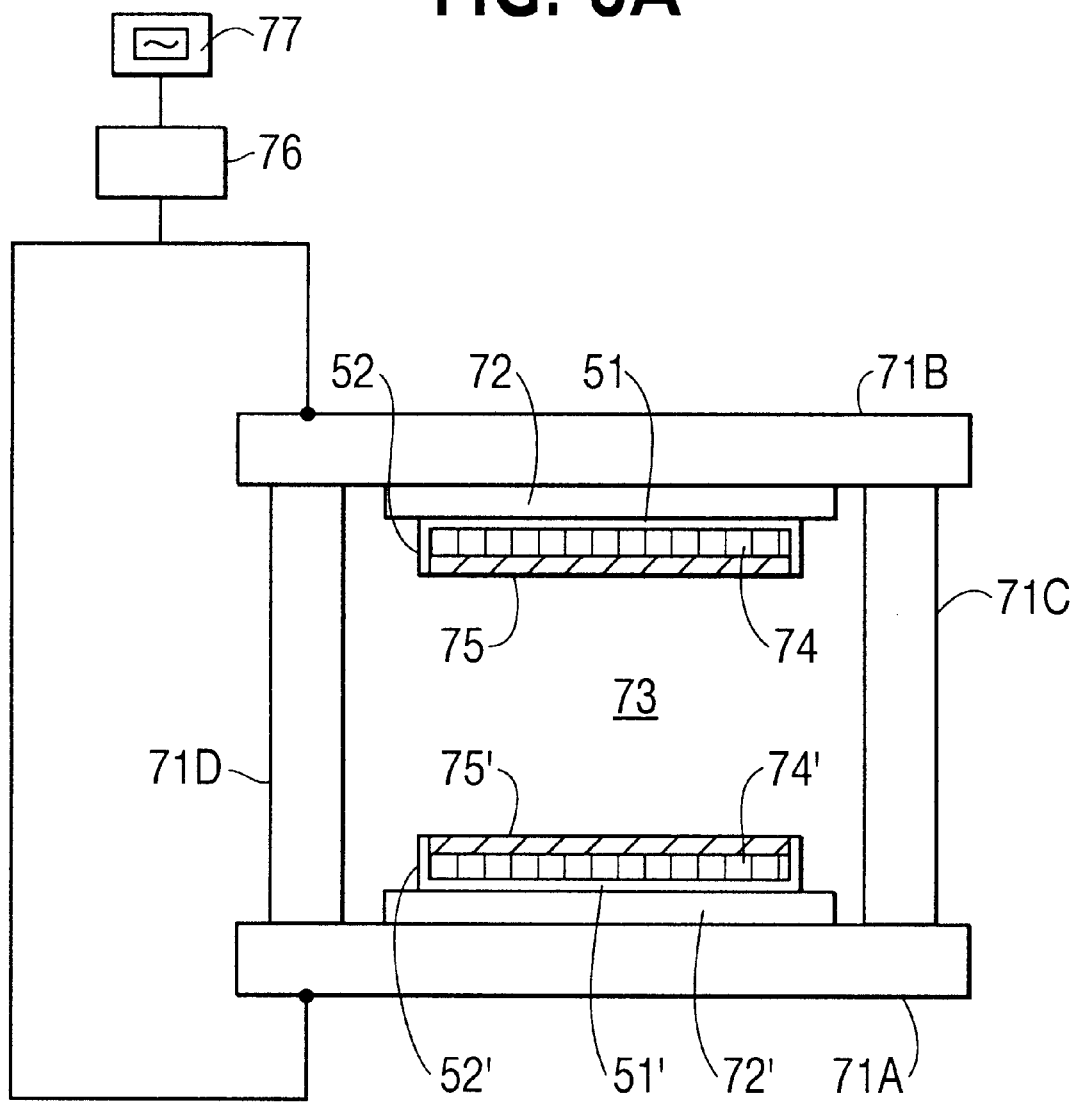

LAMINATE TILES FOR AN MRI SYSTEM AND METHOD AND APPARATUS FOR MANUFACTURING THE LAMINATE TILES

FIELD OF THE INVENTION

The present invention is directed to a method and apparatus for manufacturing laminate tiles and to laminate tiles for an MRI pole piece.

BACKGROUND OF THE INVENTION

In recent years, a so-called laminate tile pole piece has been developed for an MRI. In view of such development, a plan view of the laminate tile pole piece is shown in FIG. 1A and a side view is shown in FIG. 1B. The pole piece 10 comprises a soft iron circular base plate 11, a soft iron ring 12 around the circumference of the base 11 for directing the magnetic flux into the gap between magnets, soft ferrite laminate tiles 13 and 14 and a soft iron core 15 for mounting a gradient magnetic coil. The laminate tiles 14 in the center of the base plate 11 have a greater thickness than laminate tiles 13 at the periphery of the base plate 11 to form a convex protrusion 16. The convex protrusion 16 improves the uniformity of the magnetic field.

However, the prior art laminate tile pole piece has several disadvantages. First, most laminate tiles 13, 14 have a square or rectangular shape. However, the base 11 and the ring 12 have a circular shape. Therefore, in order to fit square or rectangular tiles into a circular opening, edge filler tiles 13A are required. As shown in FIG. 1A, each edge filler tile 13A has a unique, odd shape to allow the peripheral tiles 13 to completely fill the circular base 11 and ring 12. Each edge filler tile 13A must be formed separately from other tiles 13 to create its unique shape. This increases process costs and complexity.

Second, the protrusion 16 also has a circular shape, as shown in FIG. 1A. Therefore, in order to arrange the square or rectangular central tiles 14 in a circle, edge filler tiles 14A are required, as shown in FIGS. 1A and 1B. The edge filler tiles 14A also have a unique, odd shape to allow central tiles 14 to form a circular protrusion 16. Furthermore, in order to allow central tiles 14 to fit with the peripheral tiles 13 without leaving gaps, edge filler tiles 14A also must have two different thicknesses, as shown in FIG. 1B. Each uniquely shaped edge filler tile 14A must also be formed separately from other central tiles 14. This further increases process costs.

Third, the prior art methods of forming individual laminate tiles are based on powder metallurgy or on manual metal ribbon stacking. For example, one prior art powder metallurgy laminate tile method requires pouring metal powder into individual molds and then compressing the powder to form a tile layer. Then individual pressed tile layers are glued to other tile layers to form a laminate tile. In another prior art method, thin metal sheets are slit into long strips, each strip is then covered with epoxy, the epoxy covered strips are then individually stacked into laminate bars. The laminate bars are then transferred to a compression apparatus where they are compressed and annealed. The bars are transferred to a cutting apparatus where a saw cuts the laminate bars into square laminate tiles. Alternatively, the stacked bars may be compressed and annealed prior to being impregnated with an epoxy. These batch processes require transfer of laminate materials from station to station and a high amount of manual labor because hundreds of metal layers must be stacked by hand. These processes are complicated, expensive and prone to formation of defective tiles because of human error and possible differences between each process run.

SUMMARY OF THE INVENTION

In view of the foregoing, it would be desirable to decrease the manufacturing process cost and complexity by forming a laminated tile pole piece that does not contain oddly shaped edge filler tiles. The present invention provides a laminate tile pole piece for a magnetic resonance imaging system. The pole piece comprises a plurality of trapezoid or annular sector shaped laminate tiles arranged in a plurality of concentric rings. The laminate tiles are formed by winding a ribbon onto a polygonal bobbin to form a coil, adhering each spiral portion of the coil to at least one adjacent spiral portion of the coil, and cutting the coil into laminate tiles.

A simple and inexpensive continuous laminate tile manufacturing process that requires the minimum amount of manual labor and that produces consistent results over time would also be desirable. The present invention also provides a method of forming laminate tiles. The method comprises winding a ribbon onto a polygonal bobbin to form a coil with at least one substantially flat portion, adhering each spiral portion of the coil to at least one adjacent spiral portion of the coil and cutting the coil into laminate tiles.

The present invention also provides an apparatus for carrying out the laminate tile manufacturing process. The apparatus comprises a first means for applying adhesive to a ribbon, a second means for winding a ribbon to form a coil with at least one substantially flat portion, and a third means for curing the adhesive. Furthermore, the apparatus comprises an adhesive containing container for coating a ribbon with an adhesive, a polygonal bobbin for winding the ribbon to form a coil with at least one substantially flat portion and a heater for curing the adhesive.

BRIEF DESCRIPTION OF THE DRAWINGS

FIG. 1A is a plan view of a prior art pole piece.

FIG. 2 is a perspective view of a portion of an apparatus according to the present invention.

FIG. 3A is a front view of the apparatus of FIG. 2.

FIG. 3B is a side view of the apparatus of FIG. 2.

FIGS. 3C–3E are cross sectional views of different bobbins along line A–A' in FIG. 2.

FIG. 3F is a side cross sectional view along line B–B' in FIG. 3A of a bobbin with a coil.

FIG. 3G is a front view of a bobbin with a coil.

FIG. 3H is a view of a bobbin according to an alternative embodiment of the present invention.

FIGS. 6A and 6B are side cross sectional views of MRI systems.

DETAILED DESCRIPTION OF THE PREFERRED EMBODIMENTS

Figure 1B:
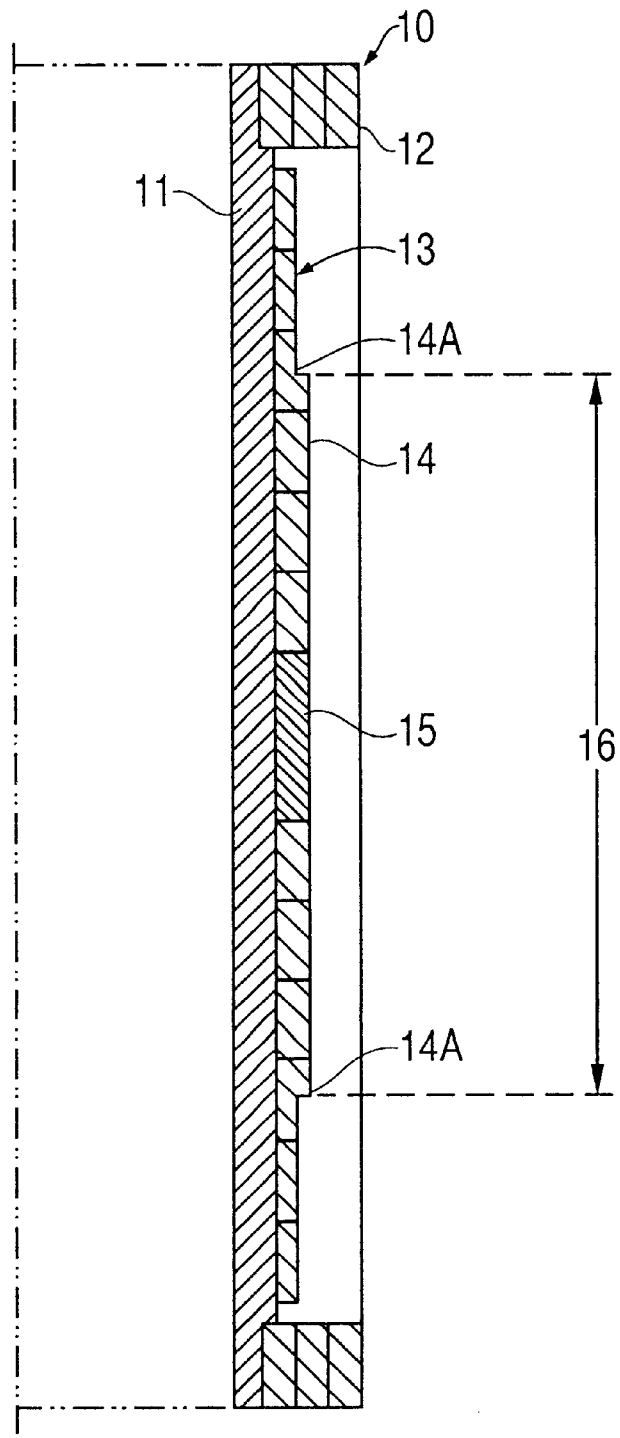
FIG. 1B is a side cross sectional view of a prior art pole piece across line X–X' in FIG. 1A.

An embodiment of a portion of an apparatus for manufacturing laminate tiles according to the present invention is shown in FIGS. 2 and 3A–E. FIG. 2 is a perspective view of the apparatus portion. FIG. 3A is a front view and FIG. 3B is a side view of the apparatus portion shown in FIG. 2. The apparatus portion 20 comprises a rotatable polygonal bobbin 21 mounted on an axle 22. The apparatus portion 20 also comprises optional bobbin side plates 23A and 23B and pressure bars 24A, 24B, 24C and 24D. The pressure bars are not shown in FIGS. 3A and 3B for clarity. The bobbin 21 and side plates 23 are axially mounted on the axle 22 and are held in place by fasteners 25A and 25B. Each fastener may be a nut if the exposed edge of the axle is threaded and acts as a bolt. The fastener may also comprise a washer that is held on the end of the axle by friction, or a washer that is attached to the side plate by screws. Preferably, the side plates 23A and 23B are mounted to the bobbin 21 by studs or bolts 26. The bobbin 21 also contains a clamp or a slit 27 for attaching a metal ribbon to the bobbin. The clamp 27 is preferably mechanically operated to allow the release of the wound metal ribbon (i.e. metal coil) from the bobbin. The pressure bars likewise may be attached to the side plates by screws. The side plates 23A and 23B may optionally contain openings 23' to allow the operator of the apparatus to observe how the metal ribbon is wound on the bobbin 21.

FIGS. 3C–3E are cross sectional views through the bobbin 21 along line A–A' in FIG. 2. The polygonal bobbin preferably has a square cross section, as shown in FIG. 3C. However, the polygonal bobbin 21 cross section may comprise any polygon or any shape that has at least one flat side. For example, the bobbin cross section may comprise a triangle, as shown in FIG. 3D, a hexagon, as shown in FIG. 3E, a pentagon, an octagon, etc., as required by the shape of the coil. There should be as many pressure bars 24 as there are flat polygonal bobbin sides. For example, if the bobbin has a hexagonal cross section, then there should be six pressure bars. The side plates 23A and 23B may have the same cross sectional shape as the bobbin 21 or they may have a different shape. For example, the side plates may have a circular shape.

As shown in FIGS. 3A and 3B, the side plates 23A and 23B are preferably larger than the bobbin 21. The larger side plates guide the metal ribbon onto the bobbin and prevent the ribbon from slipping off the bobbin.

FIGS. 3F and 3G show the polygonal bobbin 21 with a ribbon wound into a coil 28A around the bobbin. FIG. 3F is a cross sectional view taken along line B–B' in FIG. 3A, and FIG. 3G is a front view of the bobbin 21. The edge of the coil 28A is held between the bobbin 21 and the clamp 27. The coil 28A contains at least one "substantially flat portion" 29. A "substantially flat portion" means a portion of the coil that overlies a flat portion of the polygonal bobbin and has a surface that deviates from being perfectly flat by the amount that a coil bows out from being wound in a spiral about a bobbin. In other words, even though the bobbin has flat surfaces, a coil wound in a spiral about the bobbin has surfaces which may be upraised slightly higher above the middle of the flat bobbin surface than above the edge of the flat bobbin surface. The coil 28A contains as many flat surfaces as there are flat sides on the polygonal bobbin. The coil 28A is preferably a metal coil, such an amorphous iron coil to be used in MRI pole pieces. However, the coil can be made of other materials, such as paper or plastic, to be used in other applications. Preferably, the ribbon is less than $5 \times 10^{-3}$ inches thick (i.e. less than 5 mils thick), the coil is 0.1 to 10 inches thick, 1 to 30 inches wide and is wound around the bobbin 100–10,000 times. For example, the coil may be 8 inches wide and 1 inch thick when a 1 mil thick ribbon is wound around the bobbin 1000 times. However, the ribbon and the coil may have other dimensions based on the required end use.

Furthermore, the polygonal bobbin 21''' may have flat surfaces of a different size, as shown in FIG. 3H. The asymmetric coil 28A wound around such a bobbin has long substantially flat portions 29A and short substantially flat portions 29B. The asymmetric coil 28A may then by cut into large and small laminate tiles if differently shaped tiles are required, without wasting coil material during shaping.

Figure 4A:
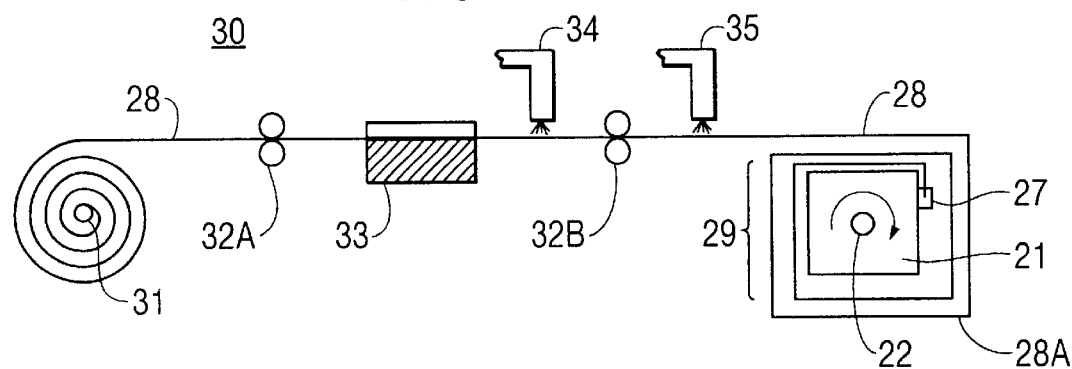
FIG. 4A is a schematic of an apparatus according to the first embodiment of the current invention.

An embodiment of a method and apparatus 30 for forming laminate tiles according to the present invention will be described with reference to FIGS. 4A–H. An as cast amorphous metal ribbon 28 is wound on a pay off spool 31, as shown in FIG. 4A. The metal ribbon 28 may be formed by slitting or cutting a metal sheet to a given width and winding it on the spool 31. Alternatively, liquid metal may be poured onto a rotating wheel or a moving belt to form an amorphous ribbon 28 which is then wound onto the spool 31. The metal ribbon is then paid off under tension from the spool 31. The tension may be provided by rollers 32A and 32B or by other tensioners known in the continuous web art, such as bars or levers.

The metal ribbon 28 is then passed though a bath of adhesive 33. The adhesive may be applied on one or on both sides of the ribbon 28. Alternatively, the adhesive may be applied to the ribbon 28 by adhesive covered rollers or from an adhesive dispensing nozzle 34 or by all of the above methods. The adhesive may comprise any adhesive substance known in the art as a metal to metal adhesive. Furthermore, the ribbon 28 may be subjected to an optional corona discharge 35 before or after the application of the adhesive to increase the adhesion strength of the ribbon 28. FIG. 4A shows that portions of the apparatus are laid out in a horizontal line. However, different portions of the apparatus may be arranged at an angle to each other or above each other. In this case, the ribbon 28 may wind around rollers 32A or 32B at an angle.

The tip of the metal ribbon 28 is inserted between the clamp 27 and the polygonal bobbin 21. The bobbin 21 is then rotated to wind the ribbon around the bobbin to form a coil with at least one substantially flat portion 29. The bobbin may be rotated by a motor (not shown) or manually.

Figure 4C:
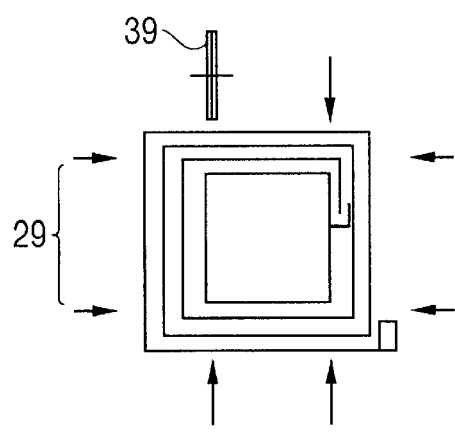
FIGS. 4B–E are side views of a coil being processed according to a method of the current invention.
Figure 4D:
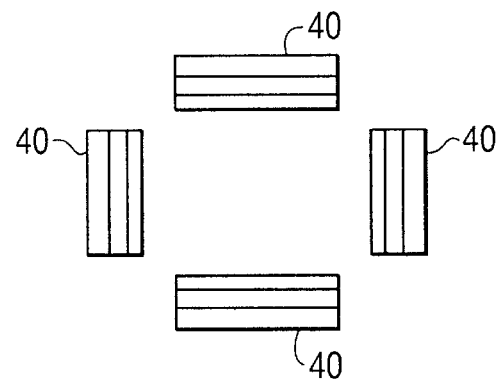
Figure 4E:
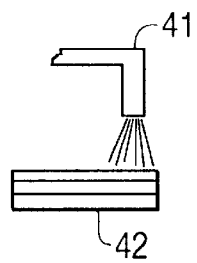
Figure 4F:
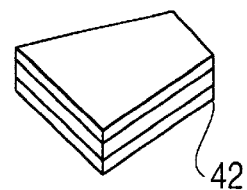
FIG. 4F is a perspective view of a laminate tile according to the first embodiment of the current invention.
Figure 4G:
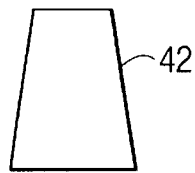
FIGS. 4G–H are plan views of laminate tiles according to the first embodiment of the current invention.
Figure 4H:
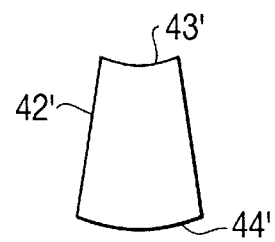
Figure 4B:
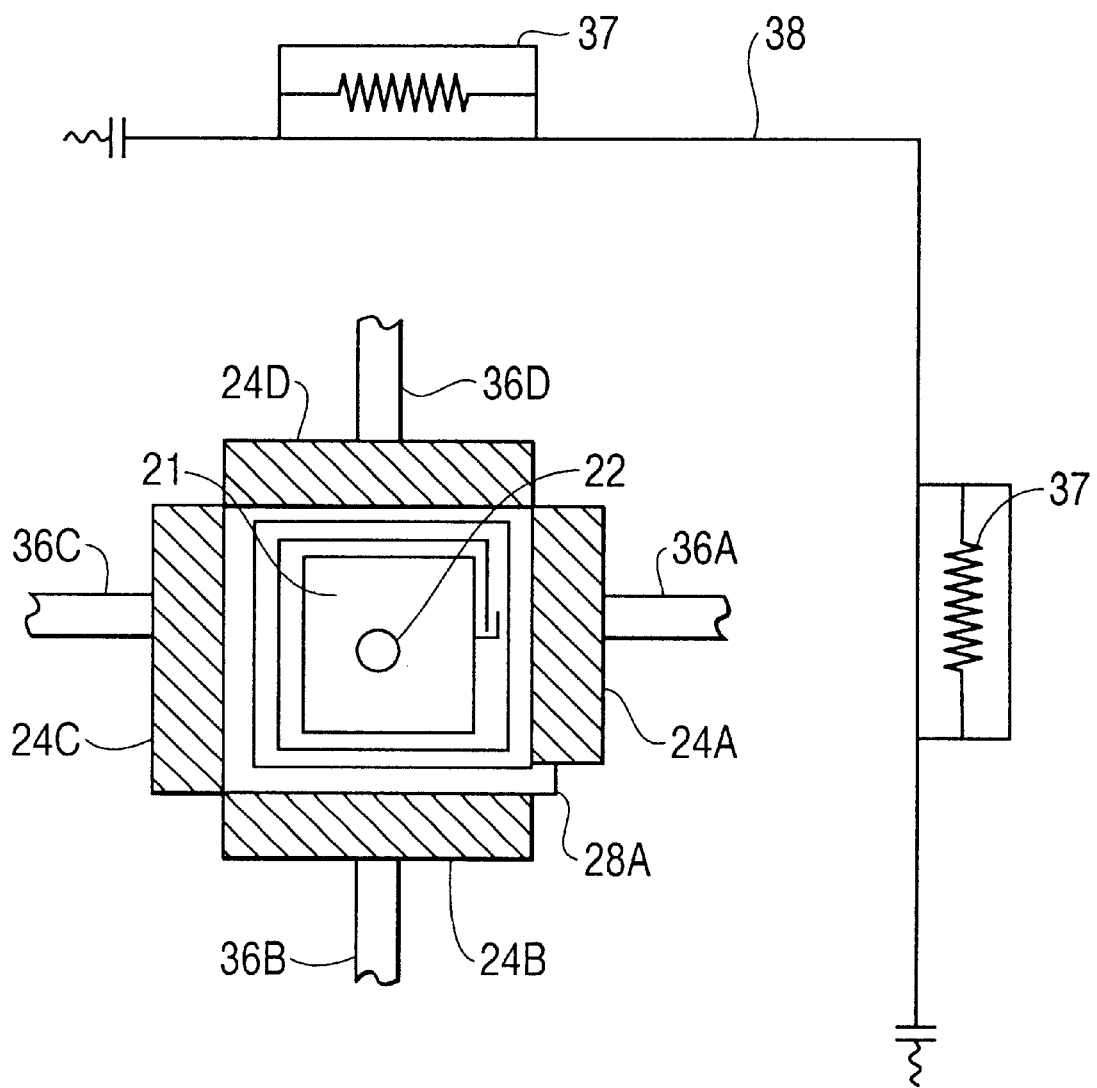

After the ribbon 28 is completely wound onto the bobbin 21, the substantially flat portions of the coil are optionally compressed by pressure bars 24A–D, as shown in FIG. 4B. The coil is compressed to control its thickness and to spread the adhesive between the portions of the coil. The pressure bars 24A–D preferably have the same shape as the substantially flat coil portions 29. For example, if the substantially flat coil portion 29 has a roughly rectangular surface area, then the pressure bar 24 acting on the coil portion 29 should also have a rectangular shape. However, the shapes of the substantially flat coil portion and the pressure bars may be different.

The pressure bars 24A–D may be attached to the side plates 23A and 23B by bolts or screws. The rotation of the screws forces the pressure bars against the coil 28A. Alternatively, the pressure bars may be part of an automated system. In this system, each pressure bar is connected to a hydraulic push arm 36A–D. The computer controlled push arms then move the pressure bars inward toward the bobbin 21 to apply pressure to the coil 28A.

The adhesive between the coil portions is then cured by the application of heat from heat sources 37. Heat sources 37 may comprise resistance heaters, heat lamps or RF coils. The heat sources 37 may be mounted inside or outside the walls 38 of the apparatus 30. The adhesive may be cured before, after or during the application of the pressure on the coil 28A. The curing temperature is a function a particular adhesive used.

The coil 28A is then preferably released from the bobbin 21, as shown in FIG. 4C. The coil 28A is released by first: removing the fasteners 25A and 25B, then removing the side plates 23A and 23B and sliding the coil 28A off the bobbin 21. The substantially flat coil portions 29 are then cut away from the coil at coil areas indicated by arrows in FIG. 4C to form laminate bars 40 shown in FIG. 4D. The coil may be cut off by any known machining method. For example the coil 28A may be cut by a circular saw 39, a band saw or by a laser. The laminate bars 40 comprise portions of the metal ribbon 28 held together by the cured adhesive. Alternatively, the coil 28A may be cut before it is removed from the bobbin 21.

The laminate bars 40 are then shaped into laminate tiles 42 by a shaper 41, as shown in FIGS. 4E–H. Preferably, the shaper 41 is a water jet. However, other shapers may be used. Furthermore, the coil 28A may be cut directly into plural laminate tiles 42 without first forming laminate bars 40. As shown in FIGS. 4F and 4G the laminate tiles 42 preferably have a trapezoidal shape. However, laminate tiles 42' may have an annular sector shape, as shown in FIG. 4H. An annular sector is a trapezoid which has a concave top or short side 43' and a convex bottom or long side 44'.

Figure 5A:
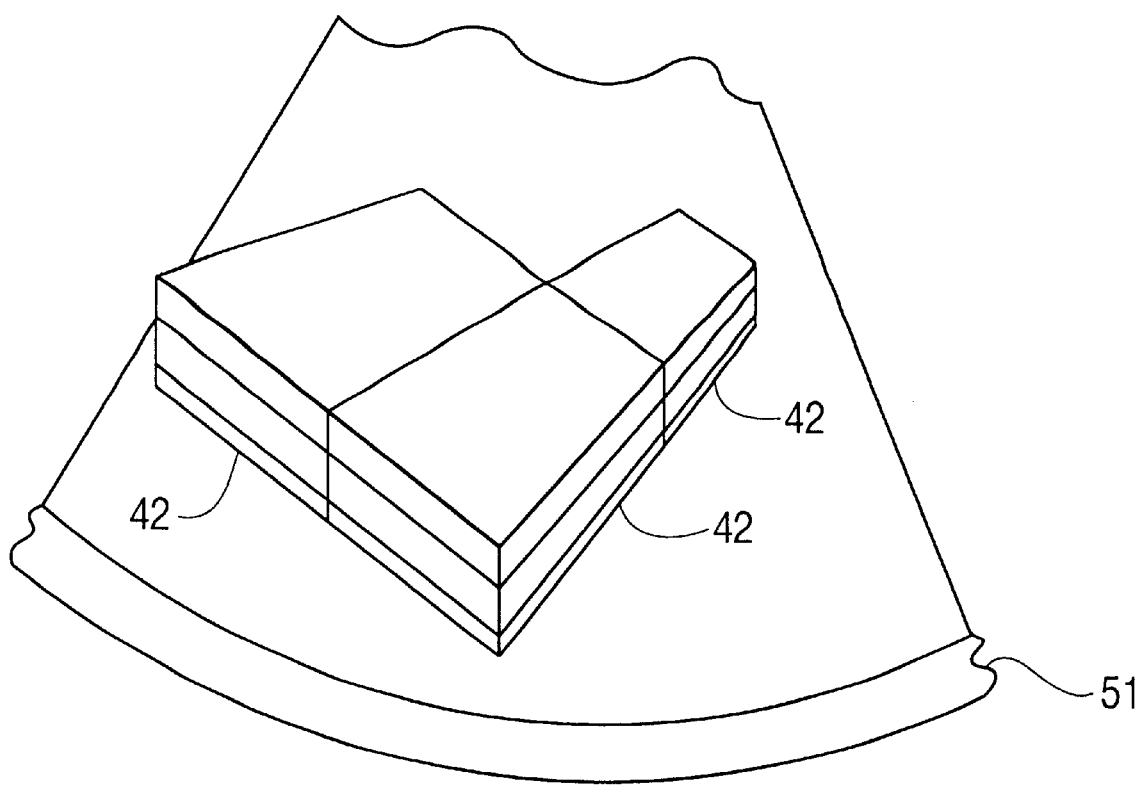
FIG. 5A is a perspective view of a laminate tile arrangement according to the first embodiment of the current invention.

The laminate tiles are then mounted side to side on a circular base as shown in FIG. 5A. FIG. 5A shows a perspective view of a cut away portion of the pole piece base 51 with three trapezoidal pole piece laminate tiles 42. The laminate tiles 42 are preferably attached to the base 51 and to each other by epoxy. One method of attaching laminate tiles 42 to the base 51 is disclosed in a copending application Ser. No. 09/198,507 Attorney Docket Number 70191/140) to E. Trifon Laskaris et al., filed on the same date the current application, and incorporated herein in its entirety.

Figure 5B:
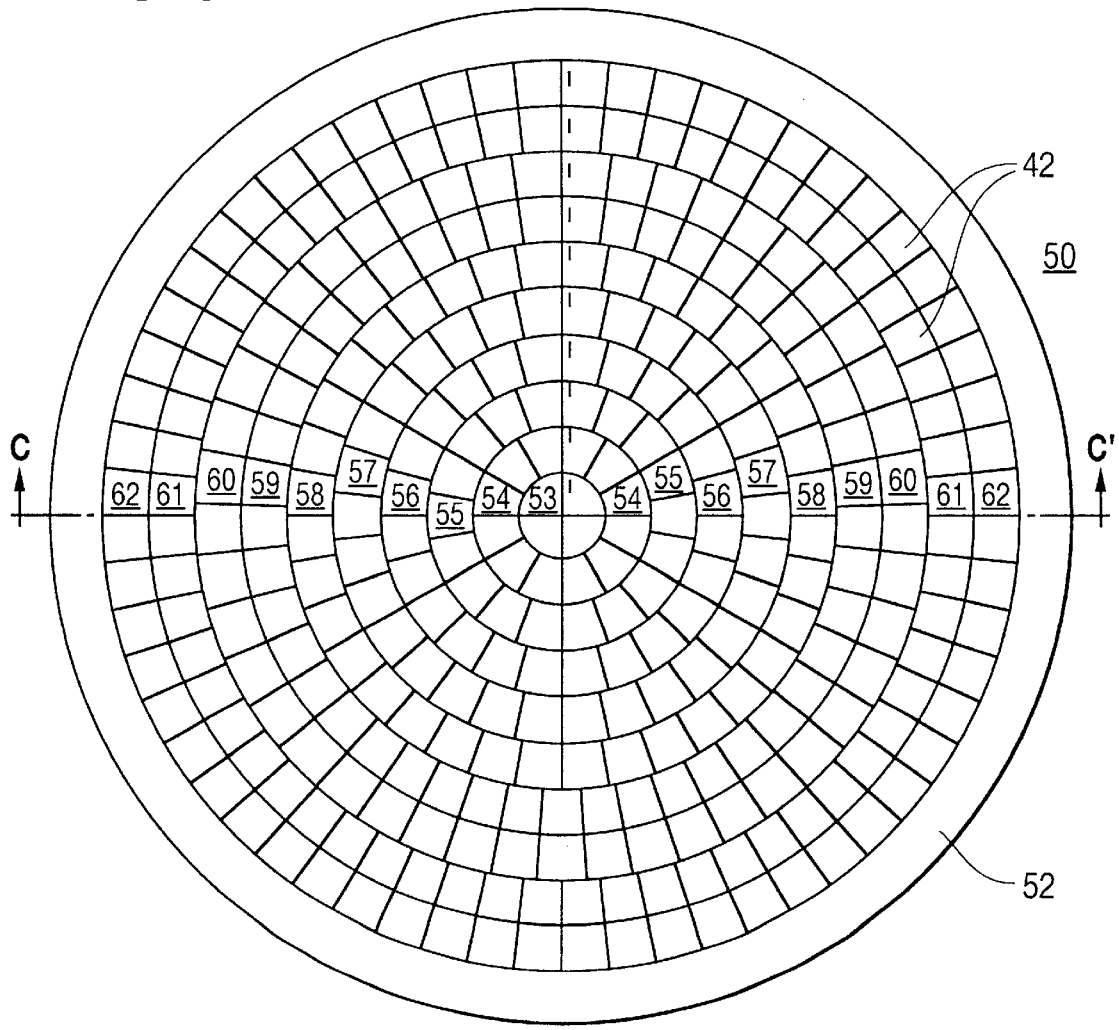
FIG. 5B is a plan view of a laminate tile arrangement according to the first embodiment of the current invention.
Figure 5C:
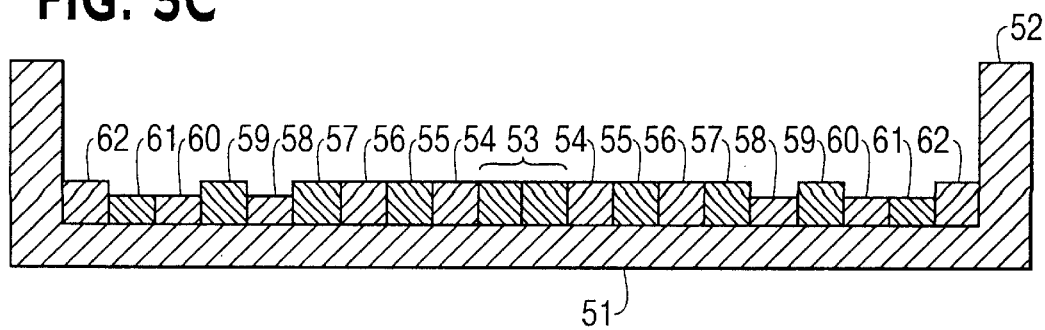
FIG. 5C is a side cross sectional view along line C–C' in FIG. 5B of a laminate tile arrangement according to the first embodiment of the current invention.

As shown in FIGS. 5B and 5C, the entire circular base 51 and a soft iron ring 52 are filled in with trapezoidal laminate tiles 42. The base 51 and ring 52 are sometimes called a "pole shoe." Alternatively, the ring 52 is sometimes called an "edge shim." FIG. 5B shows a plan view of the pole piece 50, while FIG. 5C shows a cross sectional view along line C–C' in FIG. 5B. The laminate tiles are arranged in concentric rings 53 to 62. The advantage of the trapezoidal or annular sector shape of the laminate tiles 42 becomes apparent from FIG. 5B. All laminate tiles may have the same size and shape. Therefore, no oddly shaped edge filler tiles are necessary to fill the base 51 and the ring 52. The cost and complexity of the method of assembling the laminate tile pole piece is thus reduced.

For example, the concentric tile rings 53–57 near the center of the base 51 may have a larger thickness (i.e. height as measured from the base 51) than concentric tile rings 58, 60 and 61 near the periphery of the base 51 to form a protrusion near the center of the base 51. The protrusion also does not require oddly shaped edge filler tiles. Optionally, the peripheral concentric rings 59 and 62 may also have a larger thickness than peripheral rings 58, 60 and 61. Of course other ring thickness and configurations are possible. For example, there may be more or less than 10 concentric rings. All the rings may have the same thickness or different thickness. The number of rings and the particular ring thickness should be determined by a computer simulation of magnetic field flow through the pole piece 50. Alternatively, the central ring 53 may be an iron core for mounting a gradient magnetic coil.

Furthermore, the rings may be formed by stacking plural laminate tiles 42 on each other. The thicker concentric rings may comprise more stacked laminate tiles than the thinner rings. The space between the top of the pole piece support ring 52 and the laminate tiles may optionally be filled by shims, as disclosed in U.S. Pat. No. 5,923,235 to Johannes M. van Oort, filed Oct. 23, 1998, hereby incorporated by reference in its entirety.

The present invention is particularly advantageous for forming laminate tiles of different thickness because laminate tile thickness is determined by the thickness of the coil 28A. The thickness of the coil 28A is simply determined by the number of times the ribbon 28 is wound around the bobbin 21. Therefore, the ribbon 28 may be wound more times around the bobbin 21 to form the tiles for the thicker central rings than for thinner peripheral rings. For example a coil that is wound 800 times around the bobbin may be cut and shaped into thinner tiles for the peripheral rings such as rings 58 and 60, while a coil that is wound 1000 times around the bobbin may be cut and shaped into thicker tiles for the central rings, such as rings 53–57.

Figure 6B:
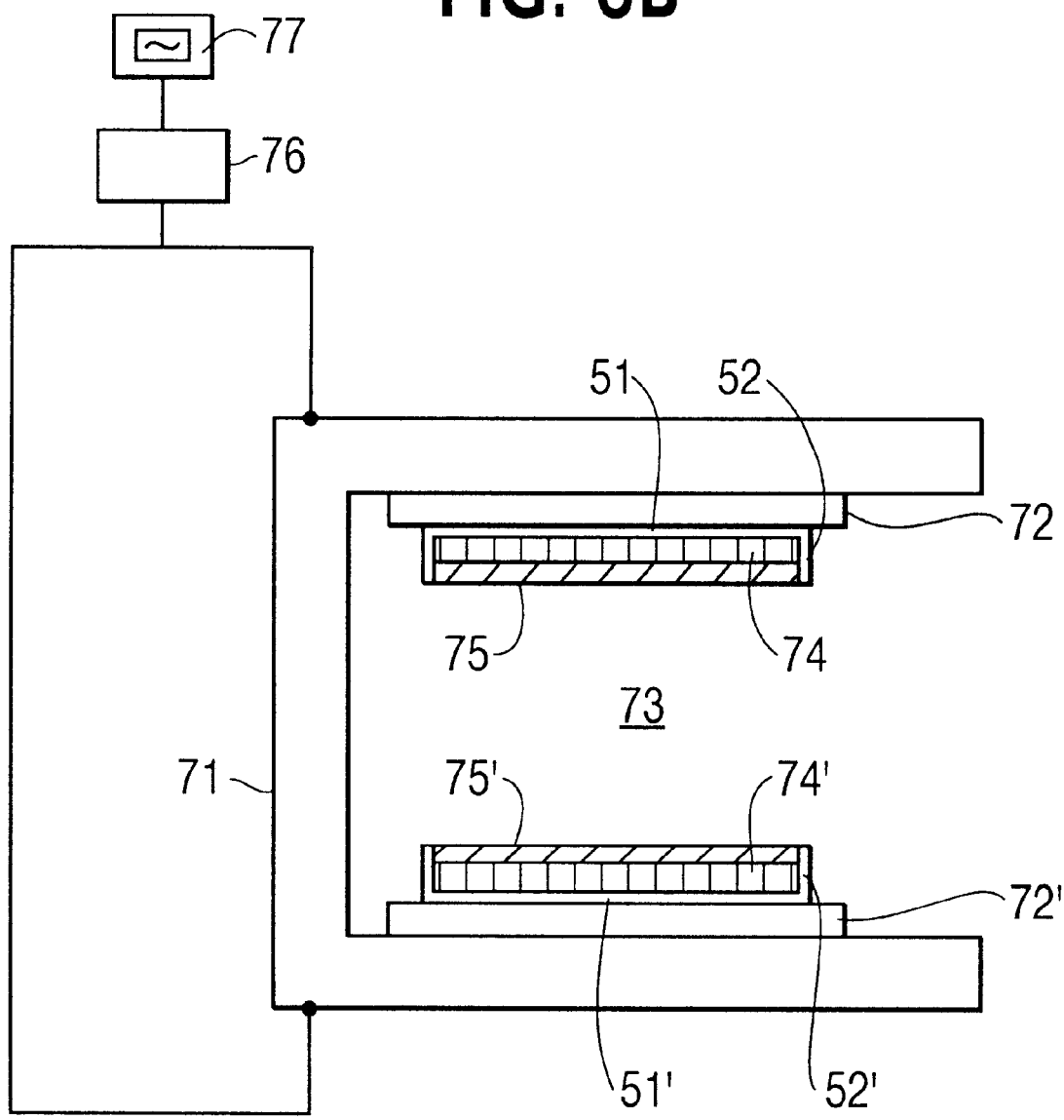

Magnetic field generating devices used for magnetic resonance imaging, MRI, ("MRI system") according to the present invention are shown in FIGS. 6A and 6B. The MRI system shown in FIG. 6A has two plate yokes 71A and 71B and at least two, and preferably four columnar yokes 71C and 71D. Alternatively, an MRI system with a single "C" shaped yoke 71 may be used as shown in FIG. 6B. The MRI systems contain magnets 72, 72' secured to yoke surfaces, pole piece bases 51, 51' and support rings 52, 52' secured to the magnets 72, 72' and laminate tile pole pieces 74, 74' secured to the pole piece bases and support rings. A gap 73 is formed between the pole pieces. A body part to be imaged is inserted into the gap 73.

The magnets 72, 72' may comprise permanent magnets such as RFeB, RCoFeB or SmCo magnets, or electromagnetic magnets, such as a conductive or superconductive coil wrapped around a core. The MRI systems may also optionally contain gradient coils or shims shown as 75, 75' in FIGS. 6A and 6B. Furthermore, the MRI systems may optionally contain an insulating, low magnetic permeability layer, such as Bakelite, synthetic resin, wood, or ceramic, between the base and the laminate tiles to reduce the remnant magnetism in the pole pieces.

The MRI systems also may contain electronics 76 and a display 77. The electronics 76 may comprise a control system, a transmitter, a receiver, an imager and/or a memory.

Figure 7A:
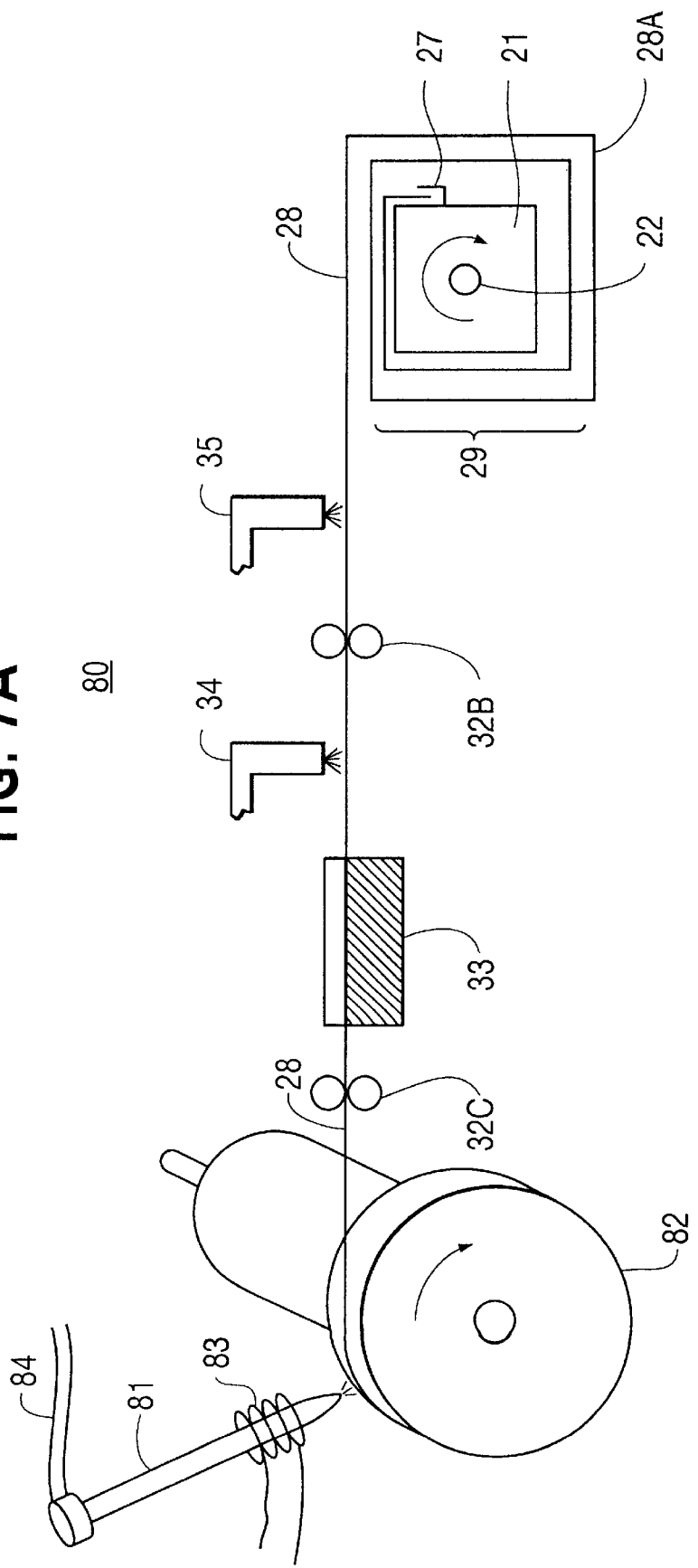
FIGS. 7A and 7B are schematics of an apparatus according to the second embodiment of the current invention.

A second embodiment of a method and apparatus for manufacturing the laminate tiles according to the present invention is shown in FIG. 7A. In this embodiment, the ribbon pay off spool 31 is omitted and ribbon 28 is manufactured during a continuous process in the same apparatus 80 as the coil 28A. The continuous process is advantageous because of reduced manufacturing time and ribbon spool transfer costs. A metal or a metal alloy is melted in a crucible 81 and ejected from an orifice at the bottom of the crucible onto a rotating wheel 82. The wheel 82 is preferably cooled by chilled water running though its inner circumference. The ejected metal alloy solidifies as a continuous amorphous ribbon 28 that comes off the wheel 82. The ribbon 28 is captured by rollers 32C and fed through an adhesive bath 33. The remaining steps are the same as in the process and apparatus described above with reference to FIGS. 4A–H. The crucible may be heated by RF coils or resistance heaters 83. The liquid metal alloy may be forced from the crucible by a pressurized inert gas supplied through pipe 84. Alternatively, the rotating wheel may be replaced by a moving belt.

Figure 7B:
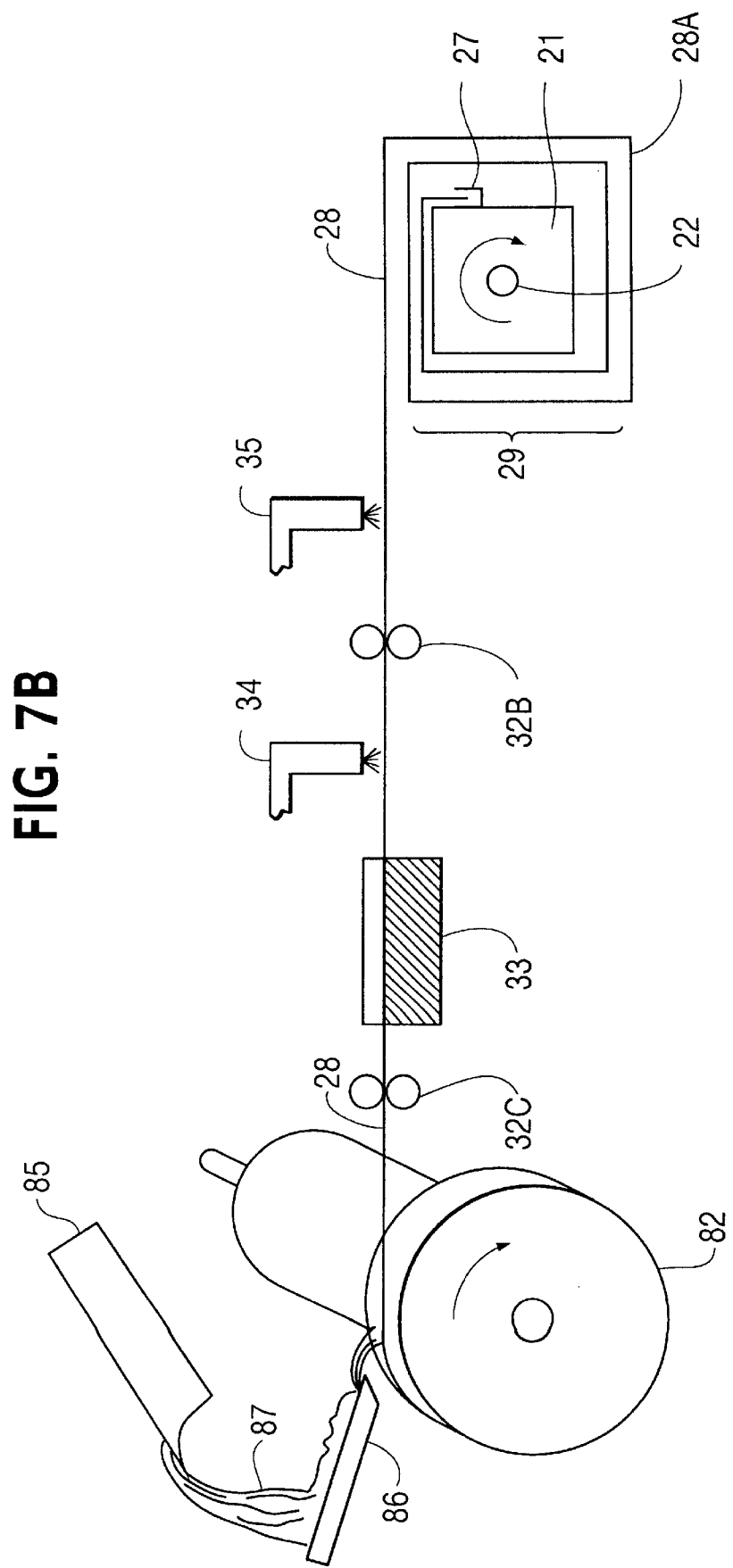

In another aspect of the second embodiment the crucible may be shaped as a bath instead of as a tube, as shown in FIG. 7B. A molten metal or metal alloy 87 is poured from a bath shaped crucible 85 onto a tun dish or spout 86. The molten metal then flows from the tun dish or spout 86 onto the quench wheel 82 to form ribbon 28.

Furthermore, the process described with respect to FIGS. 4A–H and 7A–B may be entirely automated and controlled by a computer. Computer control systems for controlling continuous web systems are known to those in the art.

Figure 8:
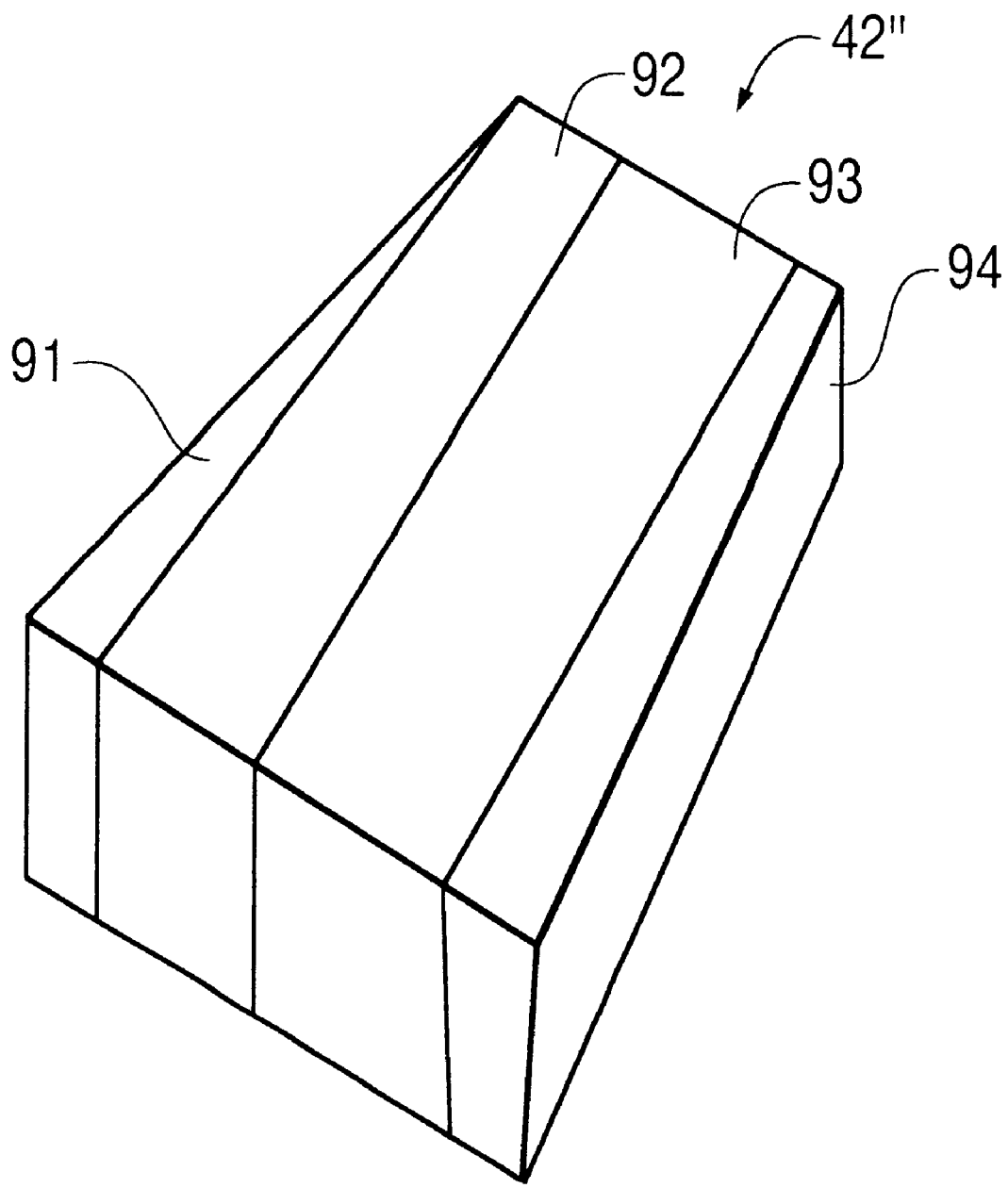
FIG. 8 is a perspective view of a laminate tile according to the third embodiment of the current invention.

In FIG. 4F, the laminate layers are laminated along the height or thickness direction of the laminate tile 42. However, in a third embodiment of the present invention, the laminate layers 91, 92, 93, 94 are stacked or laminated along the width of the laminate tile 42", as shown in FIG. 8. Laminate tile 42" is produced by removing coil 28A from bobbin 21, cutting off laminate bars 40, laying the bars 40 on their sides with the adhesive lines facing up and shaping a trapezoidal laminate tile 42" shown in FIG. 8.

Figure 9A:
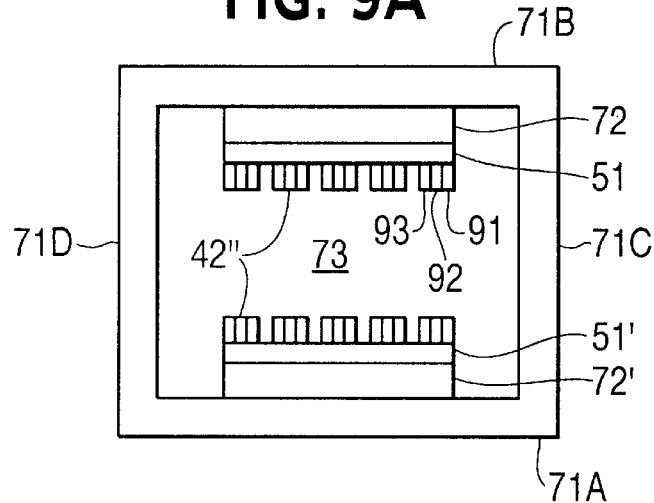
FIGS. 9A and 9B are side cross sectional views of MRI systems according to the third embodiment of the current invention.
Figure 9B:
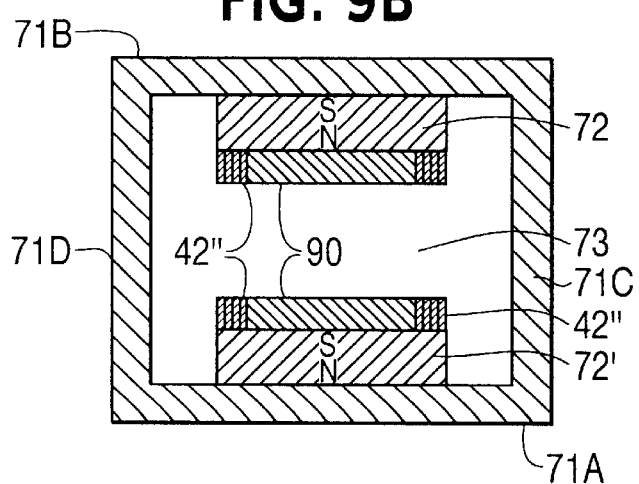
Figure 9C:
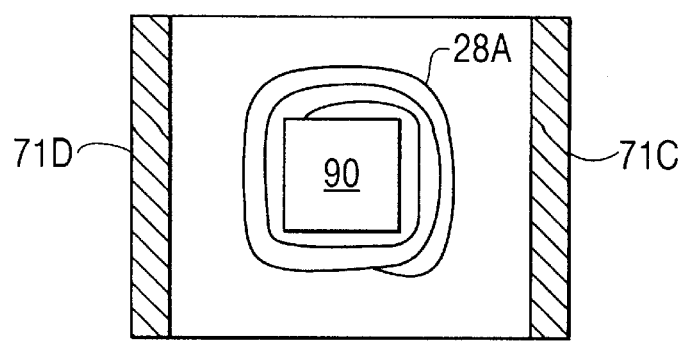
FIG. 9C is a plan view of a pole piece according to the third embodiment of the current invention.

Laminate tile 42" is mounted on the pole piece base 51 with the laminating direction perpendicular to the direction of the magnetic flux (i.e. perpendicular to an imaginary line between the bottom magnet 72' and the top magnet 72) as shown in FIG. 9A. The advantage of the this embodiment is increased stability of the magnetic field and a decrease in eddy currents and hysteresis effects. Alternatively, the laminate tile 42" may be mounted on the edge of another pole piece member 90 to reduce sideways magnetic flux leakage, as shown in FIG. 9B. Member 90 may itself comprise multiple laminate tiles 42 with layers laminated in a direction parallel to the direction of the magnetic flux (i.e. perpendicular to the laminating direction of tiles 42"). In yet another aspect of the third embodiment, the unshaped coil 28A may be mounted to the base 51 and serve as a circumferential portion pole piece, as shown in FIG. 9C. The coil 28A surrounds another pole piece member 90, which may comprise other laminated tiles.

Figure 10A:
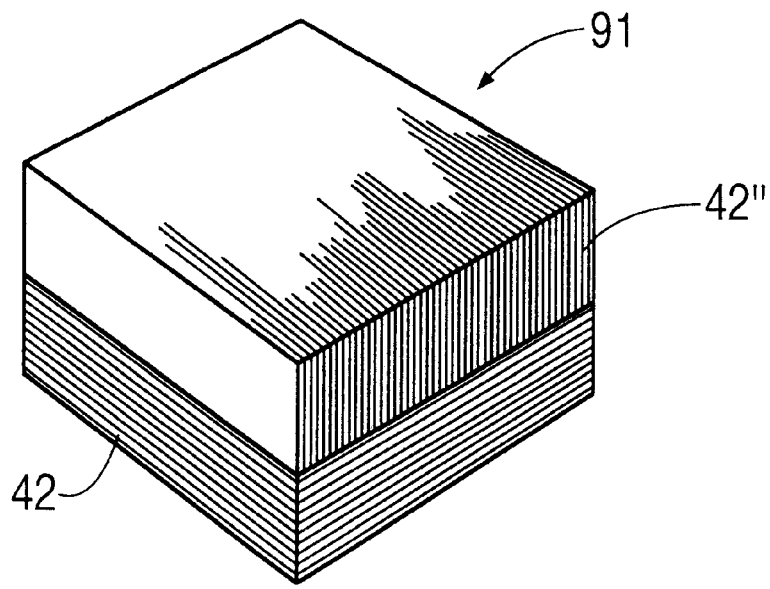
FIGS. 10A and 10B are perspective views of laminate tiles according to a fourth embodiment of the current invention.
Figure 10B:
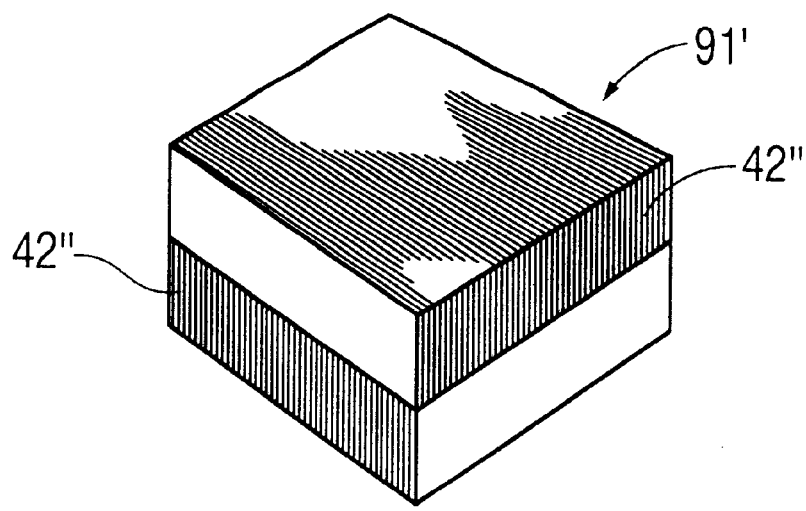

In a fourth embodiment of the present invention, laminate tiles whose laminating directions are different by 90 degrees may be attached to each other. Such an arrangement improves the uniformity of the magnetic field in the gap 73. For example, a laminate tile 42 may be attached to laminate tile 42" to form a combined tile 91 as shown in FIG. 10A. Alternatively, two tiles 42" may be attached to form a combined tile 91' as shown in FIG. 10B. Of course two tiles 42 may also be attached with their laminating directions inclined by 90 degrees to each other. The combined tiles 91 and 91' may be attached to the pole piece base 51 with any surface facing the MRI system gap 73.

The laminate pole pieces described above were fabricated from an amorphous metal. However, the metal does not have to be amorphous and may have a crystalline structure. The metal may comprise steel, iron, silicon steel or iron (i.e. non-oriented silicon steel), nickel steel or iron, permendur (FeCoV), nickel chromium steel or iron, aluminum steel or iron, aluminum chromium steel or iron or any other low coercivity material. Furthermore, the pole pieces according to the current invention may comprise laminate tiles from different metals listed above. In other words, adjacent tiles may comprise different metals. Combined tiles 91 and 91' may also comprise individual tiles made from different metals listed above.

The laminate tiles were described as being suitable for an MRI system pole piece. However, other uses for the laminate tiles, the laminate tile fabrication method and apparatus are within the scope of the current invention. Furthermore, in some applications, it may be advantageous to use laminate bars 40 without further shaping the bars into trapezoids. In this case, the laminate bars 40 may be considered "laminate tiles" for the purposes of this invention.

While the invention has been described in detail and with reference to specific embodiments thereof, it will be apparent to one skilled in the art that various changes and modifications can be made therein without departing from the spirit and scope of the invention.

What is claimed is:

1. A laminate tile pole piece for a magnetic resonance imaging system, comprising a plurality of trapezoid or annular sector shaped laminate tiles arranged in a plurality of concentric rings, wherein the laminate tiles are formed by the steps of:

winding a ribbon onto a polygonal bobbin to form a coil;
   adhering each spiral portion of the coil to at least one adjacent spiral portion of the coil; and
   cutting the coil into laminate tiles.

2. The laminate tile pole of claim 1, further comprising:
   a yoke;
   a first magnet containing a first side attached to a first portion of the yoke and a second side attached to the laminate tile pole piece;
   a second magnet attached to a second portion of the yoke;
   a second pole piece comprising a plurality of second laminate tiles attached to the second magnet and facing the laminate tile pole piece; and
   wherein the second laminate tiles are formed by winding a ribbon onto a polygonal bobbin to form a coil;
   adhering each spiral portion of the coil to at least one adjacent spiral portion of the coil; and
   cutting the coil into laminate tiles.

3. The method of forming laminate tiles comprising the steps of:

winding a ribbon onto a polygonal bobbin to form a coil with at least one substantially flat portion;

adhering each spiral portion of the coil to at least one adjacent spiral portion of the coil; and cutting the coil into laminate tiles.

4. The method of claim 3, further comprising the step of unwinding the ribbon from a spool.

5. A method of claim 3, further comprising the steps of:

melting a metal in a crucible;

pouring melted metal on a moving surface;

forming an amorphous metal ribbon coming off the wheel; and capturing and tensioning the ribbon prior to winding the ribbon onto the polygonal bobbin.

6. The method of claim 3, further comprising the step of tensioning the ribbon prior to winding the ribbon onto the polygonal bobbin.

7. The method of claim 6, further comprising the step of applying an adhesive to the tensioned ribbon.

8. The method of claim 7, wherein adhering each spiral portion of the coil comprises curing the adhesive.

9. The method of claim 8, further comprising the step of pressing the coil by pressure bars.

10. The method of claim 3, further comprising the step of releasing the coil from the polygonal bobbin prior to cutting the coil into laminate tiles.

11. The method of claim 3, where in the step of cutting the coil comprises forming trapezoid or annular sector shaped laminate tiles.

12. The method of claim 11, wherein the step of cutting the coil comprises the steps of:

separating the coil into laminate bars; and shaping the laminate bars into trapezoid or annular sector shaped laminate tiles.

13. The method of claim 11, further comprising the step of attaching plural laminate tiles side by side to form a first pole piece for an MRI, the pole piece comprising a plurality of concentric laminate tile rings.

14. The method of claim 13, further comprising the steps of:

attaching a first magnet to a yoke;

attaching the first pole piece to the first magnet;

attaching a second magnet to the yoke; and attaching a second pole piece to the second magnet.

15. The method of claim 14, wherein the laminate tile laminating direction is either parallel or perpendicular to an imaginary line between the first pole piece and the second pole piece.

16. The method of claim 11, further comprising attaching a first laminate tile over a second laminate tile to form a combined laminate tile.

17. The method of claim 16, wherein the laminating direction of the first laminate tile is perpendicular to the laminating direction of the second laminate tile.

18. An apparatus for forming laminate tiles comprising:

first means for applying adhesive to a ribbon;

second means for winding a ribbon to form a coil with at least one substantially flat portion; and third means for curing the adhesive.

19. The apparatus of claim 18, further comprising:

fourth means for compressing the coil to control the coil thickness;

fifth means for tensioning the ribbon;

sixth means for cutting the coil into laminate bars;

seventh means for shaping the laminate bars into trapezoidal or annular sector laminate tiles; and eighth means for unwinding the ribbon.

20. The apparatus of claim 18 further comprising:

a crucible for melting a metal;

a rotatable wheel for forming an amorphous metal ribbon from the molten metal poured from the crucible;

rollers for capturing the amorphous metal ribbon coming off the wheel;

a tensioning system for guiding the amorphous metal ribbon through the first means onto the second means.

21. An apparatus for forming laminate tiles comprising:

an adhesive containing container for coating a ribbon with an adhesive;

a polygonal bobbin for winding the ribbon to form a coil with at least one substantially flat portion; and a heater for curing the adhesive.

22. The apparatus of claim 21, further comprising:

a spool for unwinding the ribbon;

a tensioner for tensioning the ribbon;

at least one pressure bar for compressing the coil to control the coil thickness;

a saw for cutting the coil into laminate bars; and a water jet for shaping the laminate bars into a trapezoidal or annular sector shaped laminate tiles.

23. The apparatus of claim 21 further comprising:

a crucible for melting a metal;

a rotatable wheel for forming an amorphous metal ribbon from the molten metal poured from the crucible;

rollers for capturing the amorphous metal ribbon coming off the wheel;

a tensioning system for guiding the amorphous metal ribbon about the adhesive containing container onto the polygonal bobbin.

24. The method of claim 11, wherein the step of cutting the coil comprises cutting the coil with a saw and wherein the polygonal bobbin comprises a square bobbin.

25. The method of claim 12, wherein the step of shaping comprises applying a water jet to the laminate bars.

* * * * *